United States Patent
Megrant (10) Patent No.: US 11,690,301 B2
(45) Date of Patent: *Jun. 27, 2023

(54) REDUCING PARASITIC CAPACITANCE AND COUPLING TO INDUCTIVE COUPLER MODES

(71) Applicant: Google LLC, Mountain View, CA (US)

(72) Inventor: Anthony Edward Megrant, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/405,448

(22) Filed: Aug. 18, 2021

(65) Prior Publication Data

US 2021/0384402 A1 Dec. 9, 2021

Related U.S. Application Data (63) Continuation of application No. 16/473,779, filed as application No. PCT/US2017/066567 on Dec. 15, 2017, now Pat. No. 11,127,892.

(Continued)

(51) Int. Cl.
*H10N 60/83* (2023.01)
*G06N 10/00* (2022.01)
(Continued)

(52) U.S. Cl.
CPC .............. *H10N 60/83* (2023.02); *G06N 10/00* (2019.01); *H10N 60/01* (2023.02); *H10N 69/00* (2023.02);
(Continued)

(58) Field of Classification Search
CPC ......... H01L 39/08; H01L 27/18; H01L 39/24; H01L 21/76891; H01L 39/2493;
(Continued)

(56) References Cited

U.S. PATENT DOCUMENTS 11,127,892 B2 * 9/2021 Megrant ................ G06N 10/00
2011/0022820 A1 1/2011 Bunyk et al.
(Continued)

FOREIGN PATENT DOCUMENTS

WO WO 2010/099312 9/2010
WO WO 2017/015432 9/2010

OTHER PUBLICATIONS

EP Office Action in European Appln. No. 21159100.3, dated Jul. 23, 2021, 6 pages.

(Continued)

*Primary Examiner* — Patricia D Valenzuela
(74) *Attorney, Agent, or Firm* — Fish & Richardson P.C.

(57) ABSTRACT

A qubit coupling device includes: a dielectric substrate including a trench; a first superconductor layer on a surface of the dielectric substrate where an edge of the first superconductor layer extends along a first direction and at least a portion of the superconductor layer is in contact with the surface of the dielectric substrate, and where the superconductor layer is formed from a superconductor material exhibiting superconductor properties at or below a corresponding critical temperature; a length of the trench within the dielectric substrate is adjacent to and extends along an edge of the first superconductor layer in the first direction, and where the electric permittivity of the trench is less than the electric permittivity of the dielectric substrate.

14 Claims, 6 Drawing Sheets

Related U.S. Application Data (60) Provisional application No. 62/440,172, filed on Dec. 29, 2016.

(51) Int. Cl.

| | |
|---|---|
| *H10N 60/01* | (2023.01) |
| *H10N 69/00* | (2023.01) |
| *H01L 21/768* | (2006.01) |
| *H10N 60/10* | (2023.01) |
| *H10N 60/85* | (2023.01) |

(52) U.S. Cl.
CPC .... *H01L 21/76891* (2013.01); *H10N 60/0912* (2023.02); *H10N 60/10* (2023.02); *H10N 60/855* (2023.02)

(58) Field of Classification Search
CPC ...... H01L 39/223; G06N 10/00; G06N 10/40; B82Y 10/00; H10N 60/83; H10N 60/01; H10N 69/00; H10N 60/0912; H10N 60/12; H10N 60/855; H10N 60/10
See application file for complete search history.

(56) References Cited

U.S. PATENT DOCUMENTS

| | | | |
|---|---|---|---|
| 2013/0029848 | A1 | 1/2013 | Gonzalez et al. |
| 2014/0264287 | A1 | 9/2014 | Abraham et al. |
| 2014/0301633 | A1 | 10/2014 | Furukawa et al. |
| 2015/0119252 | A1* | 4/2015 | Ladizinsky ............ H01L 27/18 505/410 |
| 2015/0125111 | A1 | 5/2015 | Orcutt et al. |
| 2015/0340584 | A1 | 11/2015 | Chang et al. |
| 2016/0335559 | A1 | 11/2016 | Pereverzev |
| 2017/0091649 | A1 | 3/2017 | Clarke |

OTHER PUBLICATIONS

Office Action in Australian Appln. No. 2020294362, dated Dec. 13, 2021, 3 pages.
AU Examination Report in Australian Appln. No. 2017386234, dated Mar. 20, 2020, 3 pages.
AU Examination Report in Australian Appln. No. 2017386234, dated Sep. 10, 2020, 3 pages.
AU Notice of Acceptance in Australian Appln, No. 2017386234, dated Sep. 22, 2020, 3 pages.
Chu et al., "Suspending superconducting quibits by silicon micromachining," arXiv, Jun. 9, 2016, 10 pages.
Cicak et al., "Vacuum-Gap Capacitors for Low-Loss Superconducting Resonant Circuits" IEEE, Jun. 2009, 5 pages.
EP Communication pursuant to Article 94(3) EPC in European Appln. No. 17826383.6, dated Apr. 2, 2020, 11 pages.
EP Office Action in European Appln, No. 17826383,6, dated Sep. 23, 2020, 5 pages.
Extended European Search Report in European Application No. 21159100.3, dated Jul. 23, 2021, 10 pages.
JP Decision to Grant a Patent in Japanese Appln. No. 2019-535774, dated Nov. 2, 2020, 5 pages (with English translation).
JP Office Action in Japanese Appln. No. 2019-535774, dated Jun. 1, 2020, 16 pages (with English translation).
KR Notice of Allowance in Korean Appln. No. 10-2019-7022107, dated Nov. 25, 2020, 3 pages (with English translation).
KR Office Action in Korean Appln. No. 10-2019-7022107, dated Jul. 1, 2020, 11 pages (with English translation).
Malissa et al., "Superconducting coplanar waveguide resonators for low temperature pulsed electron spin resonance spectroscopy" arXiv, Feb. 2012, 4 pages.
PCT International Preliminary Report on Patentability in International Appln. No. PCT/US2017/066567, dated Jul. 11, 2019, 14 pages.
PCT International Search Report and Written Opinion in International Appln. No. PCT/US2017/066567, dated Mar. 21, 2018, 21 pages.
PCT Written Opinion of the International Preliminary Examining Authority in International Appln. No, PCT/US2017/066567, dated Dec. 15, 2017, 9 pages.
Sandberg et al., "Etch induced microwave losses in titanium nitride superconducting resonators," Applied Physics Letters, Jun. 2012, 100:262605-1-262605-4.
Wallquist et al., "Selective coupling of super conducting qubits via tunable stripline cavity" arXiv, Oct. 2006, 11 pages.
Office Action in Canadian Appln. No. 3,049,097, dated Mar. 2, 2022, 5 pages.
Office Action in Chinese Appln. No. 201780085510.5, dated Dec. 2, 2022, 17 pages (with English translation).
Notice of Acceptance for Patent Application in Australian Appln. No. 2020294362, dated Jul. 21, 2022, 3 pages.

* cited by examiner

REDUCING PARASITIC CAPACITANCE AND COUPLING TO INDUCTIVE COUPLER MODES

CROSS-REFERENCE TO RELATED APPLICATIONS

This application is a continuation application of, and claims priority to, U.S. patent application Ser. No. 16/473,779, filed Jun. 26, 2019, which is a national stage application under 35 U.S.C. § 371 of PCT International Application No. PCT/US2017/066567, filed on Dec. 15, 2017, which claims the benefit under 35 U.S.C. § 119(e) of U.S. Provisional Application Ser. No. 62/440,172, filed Dec. 29, 2016. The contents of the foregoing applications are hereby incorporated by reference.

TECHNICAL FIELD

The present disclosure relates to reducing parasitic capacitance and coupling to inductive coupler modes.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as a $|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

The subject matter of the present disclosure relates to techniques for reducing parasitic capacitance and coupling to coupler modes.

In general, an innovative aspect of the subject matter described herein can be embodied in a qubit coupling device, where the qubit coupling device includes a dielectric substrate having trench and a first superconductor layer on a surface of the dielectric substrate, where an edge of the first superconductor layer extends along a first direction on the surface of the dielectric substrate. At least a portion of the superconductor layer is in contact with the surface of the dielectric substrate. The superconductor layer is formed from a superconductor material which exhibits superconducting properties at or below a corresponding critical temperature. A length of the trench within the dielectric substrate is adjacent to and extends along the edge of the first superconductor layer in the first direction. Additionally, the trench has an electric permittivity that is less than an electric permittivity of the dielectric substrate.

In some implementations, a width of the trench extends to the edge of the superconductor layer, without extending underneath the first superconductor layer. The width of the trench can at least partially extend or entirely extend underneath the first superconductor layer.

In some implementations, the substrate includes one or more pillars within the trench and supporting the first superconductor layer.

The superconductor layer may form part of an inductive or capacitive coupler or part of a qubit, among other components of a quantum computing circuit device. In some implementations, the qubit coupling device includes at least an adjustable coupler network and at least one coupler control line. In some implementations, the qubit coupling device is coupled to a qubit device, the qubit device including a second superconductor layer on the surface of the dielectric substrate, where at least a portion of the second superconductor layer is in contact with the surface of the dielectric substrate and includes the superconductor material. The qubit device can be, for example, a gmon qubit, an xmon qubit, or a flux qubit.

A trench adjacent to a superconductor layer may have many forms including: a trench whose walls are adjacent to the superconductor layer. Another trench may include undercutting of the superconductor layer, such that the trench is at least partially underneath the superconductor layer. A third instance of a trench may involve undercutting the superconductor layer fully such that a part of the superconductor layer is floating between pillars to the dielectric substrate.

In some implementations, a trench adjacent to two superconductor layers may be at least as deep at two superconductor layers are apart. For example, for two parallel superconductor strips with a 2-micron separation, the depth of a trench in the dielectric substrate located between the two parallel superconductor strips would be at least 2 microns deep.

In general, in some aspects, the subject matter of the present disclosure may be embodied in methods for fabricating a qubit coupling device including providing a dielectric substrate, depositing a first superconductor layer on a surface of the dielectric substrate where an edge of the first superconductor layer extends along a first direction and where at least a portion of the first superconductor layer is in contact with the surface of the dielectric substrate and includes a superconductor material that exhibits superconductor properties at or below a corresponding critical temperature. A trench is etched within the dielectric substrate, where a length of the trench within the dielectric substrate is adjacent to and extends along the edge of the first superconductor layer in the first direction, and an electric permittivity of the trench is less than an electric permittivity of the dielectric substrate.

In some implementations, etching the trench includes performing an anisotropic etch of the dielectric substrate.

In some implementations, etching the trench includes patterning the first superconductor layer to include one or more holes that extend from a top surface of the superconductor layer to the dielectric substrate, exposing the qubit coupling device to an etchant such that the etchant etches the dielectric substrate through the one or more holes, and removing the etchant to leave multiple pillars in the dielectric substrate that support the first superconductor layer.

Particular embodiments of the subject matter described in this specification can be implemented so as to realize one or more of the following advantages. By forming trenches within the dielectric substrate and adjacent to and/or underneath the superconductor layer, the effective dielectric constant of the region may be reduced significantly. For example, in some implementations, the effective dielectric constant of the region may be reduced by a factor of up to about 6.2 in the case of a trench formed within a silicon wafer. In some implementations, in order to achieve a full factor of 6.2 reduction of the effective dielectric constant in the region, a trench may be formed entirely underneath the superconductor layers, with the exception of the ends of the superconductor layers that are supported by the substrate, would need to be removed. By reducing the effective dielectric constant, the parasitic capacitance may be reduced in kind, by a factor of 6.2. The reduction in parasitic capacitance may cause a shift in in the frequency of the parasitic modes to frequencies further away from the transition frequency of a qubit device.

The technique described herein may be implemented for various quantum computing devices including gmon qubits coupled to tunable inductive coupling networks, where it can suppress parasitic modes between transmission lines located in an inductance coupling network and the qubit. Furthermore, adding trenches adjacent and/or underneath the superconductor layers will reduce the effective permittivity of the region (due to the trench having a lower dielectric constant than the dielectric substrate) while maintaining the same magnetic permeability of the region (due to the dielectric substrate and vacuum having the same permeability). Adding trenches adjacent to and/or underneath the superconductor layers thus may minimize the capacitance while providing the same inductance per unit length. This feature will create additional flexibility for novel design parameters and layouts (e.g., device proximity and sizes). For example, by reducing parasitic capacitance by 6.2×, a coplanar waveguide can be increased in length by 2.5× while remaining at the same frequency, potentially creating additional physical space for 2.5× more qubits. Furthermore, reducing the parasitic capacitance may reduce the sensitivity of the coherence times of a qubit (e.g., a fluxmon qubit) to flux noise, while keeping other parameters of the qubit constant. Additionally, the transmission lines may have reduced defect densities and may additionally have lower background dissipation levels. The technique described herein may also be applied to xmon qubits and flux qubits.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Quantum computing entails coherently processing quantum information stored in the quantum bits (qubits) of a quantum computer. Superconductor quantum computing is a promising implementation of quantum computing technology in which quantum computing circuit elements are formed, in part, from superconductor materials. Superconductor quantum computers are typically multilevel systems, in which only the first two levels are used as the computational basis. In certain implementations, quantum computing circuit elements, such as qubits, are operated at very low temperatures so that superconductivity can be achieved and so that thermal fluctuations do not cause transitions between energy levels. Additionally, it may be preferable that the quantum computing circuit elements are operated with low energy loss and dissipation (e.g., the quantum computing circuit elements exhibit a high quality factor, Q). Low energy loss and dissipation may help to avoid, e.g., quantum decoherence.

Fabrication of integrated quantum computing circuit elements with superconductor components typically involves depositing and patterning superconductor materials, dielectrics and metal layers. Superconductor material may be used to form various quantum computing circuit elements and components such as, e.g., Josephson junctions, superconductor co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In some implementations, quantum computing circuit elements may exhibit a parasitic capacitance that causes coupling of qubit devices to undesired parasitic modes. In particular, in certain cases, the parasitic capacitance may give rise to one or more modes that operate at frequencies near the transition frequency of a qubit device, such that the qubit device, when excited, couples to the parasitic modes, leading to decoherence. A Gmon coupler is an example of quantum computing circuit element that may, in some implementations, lead to coupling of qubit devices to unwanted parasitic modes. A Gmon coupler may be understood to include at least two qubit devices that are coupled through a tunable coupling network. The Gmon coupler may have a planar architecture in which a patterned superconductor layer on a dielectric substrate forms the qubit devices and coupling network. The coupling network, in particular, may be formed from a superconductor line having a junction that acts as a tunable inductor to control the coupling strength between the qubit devices. An exemplary Gmon coupler may be operated as follows: a first qubit device (Q1) of the Gmon coupler is excited; the frequency of the Q1 then is varied while the frequency of the second qubit device (Q2) is fixed until a resonance interaction occurs and the excited state from Q1 is coupled to Q2. In some implementations, the coupler network exhibits parasitic modes to which the excited qubit couples instead of the other qubit device. The parasitic modes of the coupler network may be near the $|0\rangle-|2\rangle$ transition frequency of the qubit devices, e.g., near a frequency of about 12 GHz at zero bias. In some implementations, qubits in their ground state $|0\rangle$ are excited into the parasitic modes by one or more couplers in a coupler network. The parasitic coupler modes may be excited due to external couplings from the control lines for the coupler network. While the parasitic coupling is described above with respect to Gmon couplers, such parasitic coupling may occur in other types of qubit devices (e.g., Xmon qubits, Fluxmon qubits, transmon qubits, among others) and other types of qubit couplers.

The present disclosure relates to reducing parasitic capacitance and coupling to undesired parasitic modes of circuit elements by reducing the electric permittivity in an area adjacent to the circuit element. For example, to reduce the electric permittivity, trenches may be formed in a dielectric substrate adjacent to the circuit element. The trenches may have an electric permittivity that is lower (e.g., substantially lower) than the permittivity of the dielectric that the trench replaces. As result, the parasitic capacitance of the circuit element may be reduced in kind. A reduction in parasitic capacitance may lead to a shift in the frequency of the parasitic modes away from the resonant frequency of the qubit devices. Shifting the frequency of the parasitic modes away from the resonant frequency of the qubit devices may reduce the likelihood of unwanted coupling to the parasitic modes, and therefore reduce the probability of qubit decoherence.

The different trenches and fabrication techniques described herein may be utilized in a variety of configurations for various quantum computing circuit elements, and the discussed exemplary structures discussed herein do not represent the full extent of implementations possible.

FIGS. 1A-1D are schematics that illustrate a top view and different possible cross-sectional views of exemplary structures for reducing parasitic capacitance in quantum computing circuit elements. The structures shown in FIGS. 1A-1D include a layer of superconductor material 102 formed on the surface of a dielectric substrate 104. The superconductor material 102 and, in some cases, the substrate 104 may form part or all of a quantum computing circuit element, such as a qubit device (e.g., a fluxmon qubit, a gmon qubit, an xmon qubit or other qubit device), a Josephson junction, a quantum LC oscillator, a SQUID, or a co-planar waveguide, among other circuit elements.

Figure 1A:
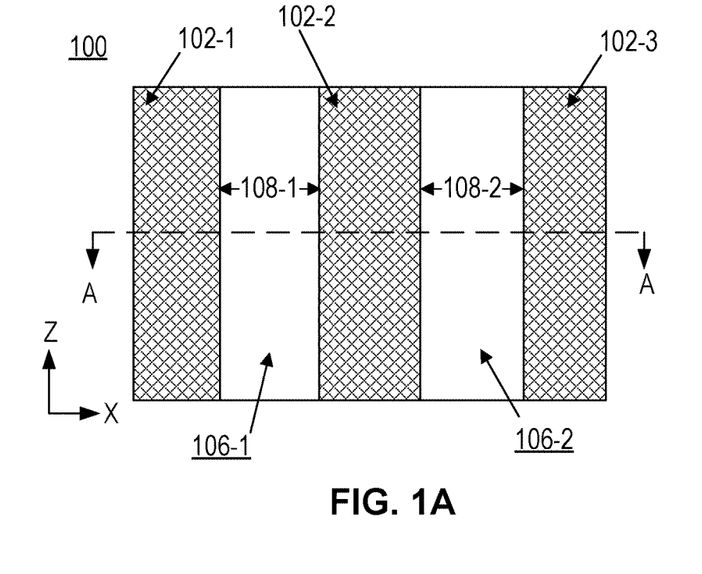
FIGS. 1A-D are schematics that illustrate various top view and cross-sectional views of exemplary trenches adjacent to superconductor layers on dielectric substrates.
Figure 1B:
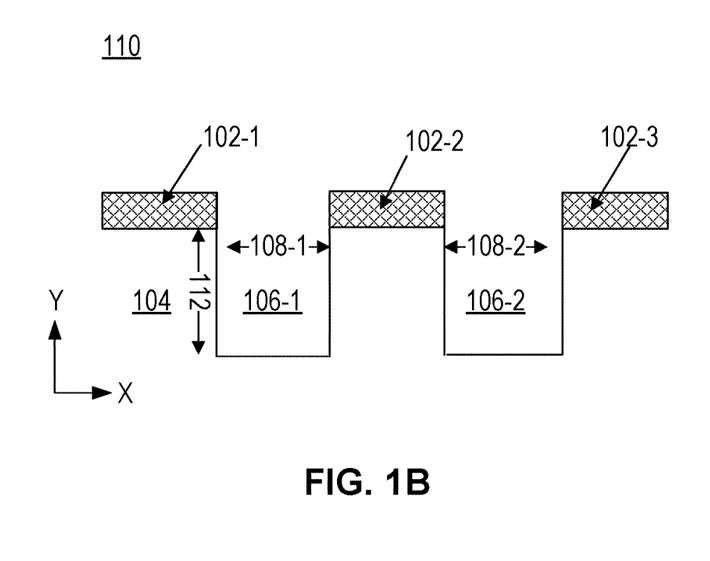
Figure 1C:
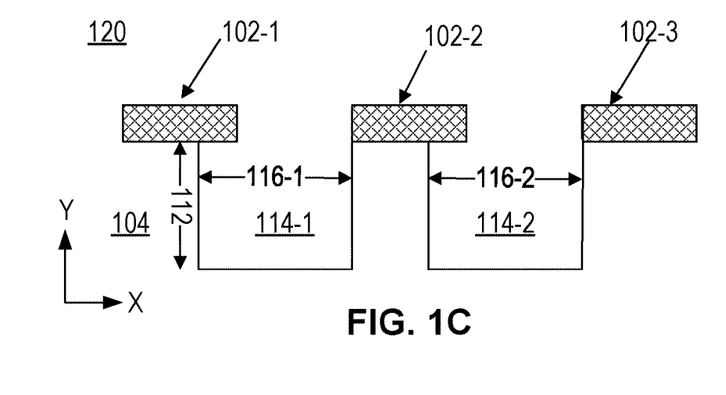
Figure 1D:
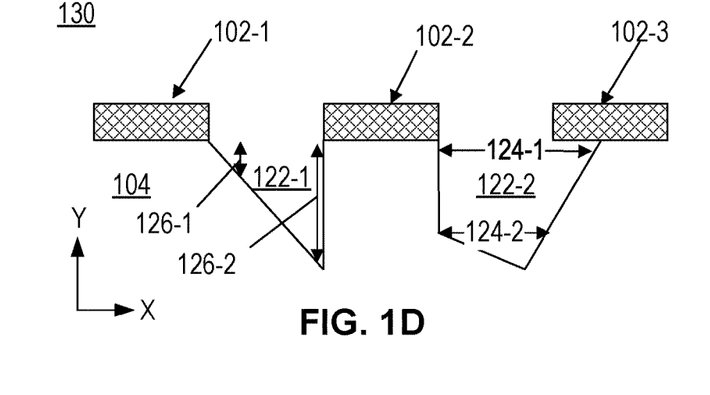

The superconductor layers 102 depicted in FIGS. 1A-1D (and FIGS. 2A-2D) may be co-deposited structures, deposited in separate steps, deposited in a single layer and post-processed to fabricate separate structures, and so on. Each of FIGS. 1B-1D depicts a different possible configuration of a trench region that is formed within the dielectric substrate 104 and adjacent to the superconductor layer 102, in which the trench region has a relative electric permittivity lower than (e.g., substantially lower than) the relative electric permittivity of the substrate 104. For example, the trench regions may be constituted of, e.g., vacuum or air. Typical vacuum conditions (e.g., ultra-high vacuum (UHV) conditions) can include pressures below approximately $10^{-9}$ Torr. The presence of the trench region having a lower relative electric permittivity adjacent to the superconductor layer 102 may, in some implementations, reduce the parasitic capacitance exhibited by the quantum computing circuit element to which the superconductor layer 102 belongs.

FIG. 1A is a schematic 100 illustrating a top view of superconductor layers 102-1, 102-2, and 102-3 on a dielectric substrate 104. Superconductor layer 102-1 is separated from superconductor layer 102-2 by a first distance 108-1. The superconductor layer 102-2 is separated from the superconductor layer 102-3 by a second distance 108-2. A first trench 106-1 is formed in the region between and adjacent to superconductor layer 102-1 and superconductor layer 102-2. A second trench 106-2 is formed in the region between and adjacent to superconductor layer 102-2 and superconductor layer 102-3.

FIG. 1B is a schematic 110 illustrating a cross-sectional view of the superconductor layers 102-1, 102-2, and 102-3 depicted in FIG. 1A along a cross-section line A-A, according to a first configuration of the trenches 106-1 and 106-2. In this configuration, the first and second trenches, 106-1 and 106-2, are located adjacent to superconductor layers 102 and have widths 108-1 and 108-2, respectively. That is, the width of the first trench 106-1 is substantially the same as the first distance 108-1 between the superconductor layer 102-1 and superconductor layer 102-2. The width of second trench 106-2 is substantially the same as the second distance 108-2 between the superconductor layer 102-2 and superconductor layer 102-3. For each trench, the width of the trench extends to a plane that is co-planar with the edges of the superconductor layers 102, without extending underneath the superconductor layers 102. Each trench 106-1 and 106-2 has a depth 112. As depicted in FIG. 1B, depth 112 extends into the dielectric substrate from a plane that is co-planar with the bottom surface of a superconductor layers 102. Although trenches 106-1 and 106-2 are depicted in FIG. 1B as having the same depth 112, in some implementations, the trenches may have different depths. In some implementations, a trench depth may be established by the amount of a dielectric substrate that is removed by an etching process, which will be discussed in more detail with reference to FIGS. 3A and 3B below.

FIG. 1C is a schematic 120 illustrating a cross-sectional view of the superconductor layers 102-1, 102-2, and 102-3 along a cross-section A of FIG. 1A according to a second different configuration. In the second configuration, the first and second trenches, 114-1 and 114-2 have widths 116-1 and 116-2, respectively, and a trench depth of 112. Again, first trench 114-1 is located adjacent to superconductor layers 102-1 and 102-2, and second trench 114-2 is located adjacent to superconductor layers 102-2 and 102-3. In this configuration, a portion of each of first and second trench 114-1 and 114-2 partially extends underneath at least one superconductor layer. For example, at least a portion of the width of trench 114-1 extends under superconductor layer 102-1, and at least a portion of the width of trench 114-2 extends under superconductor layer 102-2. The amount that the trench width extends underneath the superconductor layer may vary.

FIG. 1D is a schematic 130 illustrating a cross-sectional view of superconductor layers 102-1, 102-2, and 102-3 along a cross-section A of FIG. 1A according to a third different configuration. Again, two trenches, 122-1 and 122-2, are located adjacent to respective superconductor layers. In contrast to the trenches shown in FIGS. 1B-1C, trenches 122-1 and 122-2 do not have rectangular cross-sections. Trenches 122-1 and 122-2 have varying trench widths and depths (e.g., the width of trench 122-2 may vary from a first width 124-1 to a second width 124-2). Each trench may have a depth that varies as well (e.g., the depth of trench 122-1 may vary from a first depth 126-1 to a second different depth 126-2. In some implementations, irregular trench shapes may be preferable for a variety of reasons including fabrication ease. For example, for some dielectric substrates (e.g., off-axis silicon wafers) the dielectric substrate will etch preferentially along a particular crystalline orientation, such that trenches formed will have irregular geometries that follow a crystalline orientation.

Trench widths, depths, and lengths may range in value depending on the type of trench and the quantum computing circuit element in which the trench is incorporated. For example, a trench may have a length between about 1 micron to about 5 mm. In some implementations, the length of the trench may extend to the same length as the adjacent circuit element to which the trench is formed. For example, for a superconductor layer formed as a co-planar waveguide qubit coupler element, the trench may have a length that extends along the entire length of the co-planar waveguide qubit coupler element (e.g., the trench may have the same length as the co-planar waveguide qubit coupler element). A trench may have a width between several nanometers (e.g., 5-10 nm) to several microns or several tens of microns. In some implementations, a depth of the trench would be of similar scale to the width of the trench, for example, a coplanar waveguide where a width of a trench between features of the coplanar waveguide is 5-10 nm, a depth of the trench would also be on the order of 5-10 nm. Additionally, in some implementations, the trench may have a depth of up to several hundred microns.

FIGS. 2A-D are schematics that illustrate different views of an exemplary floating superconductor layer on a dielectric substrate.

Figure 2A:
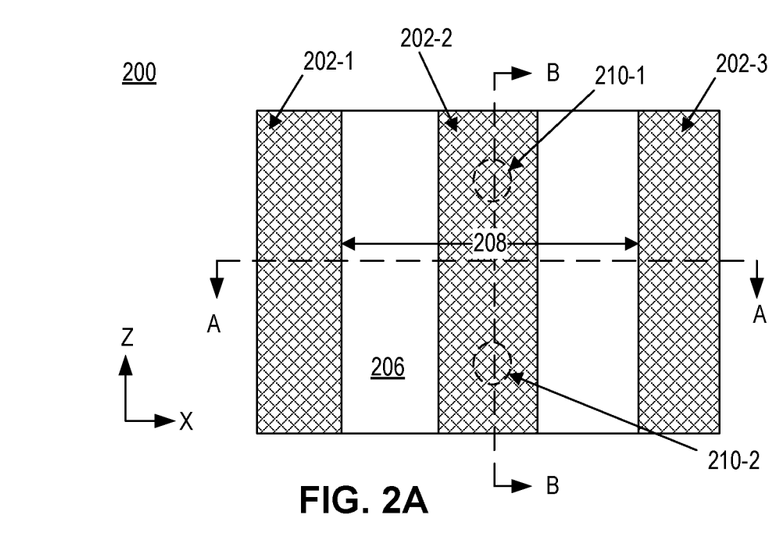
FIGS. 2A-D are schematics that illustrate different views of an exemplary floating superconductor layer.

FIG. 2A is a schematic 200 illustrating a top view of superconductor layers 202-1, 202-2, and 202-3 over a dielectric substrate 204. A trench 206 within the dielectric substrate 204 is located adjacent to superconductor layers 202-1, 202-2, and 202-3. In this schematic, the width 208 of the trench 206 extends to a plane that is co-planar with the edges of the superconductor layers 202-1 and 202-3. Additionally, trench 206 extends fully underneath superconductor layer 202-2, such that portions of the superconductor layer 202-2 are floating between two pillars 210-1 and 210-2. In some implementations, pillars are portions of the dielectric substrate 204 that have not been removed to form the trench 206. In some implementations, a superconductor layer may have one, two or more pillars 210 between a bottom surface of the superconductor layer and the dielectric substrate 204.

Figure 2B:
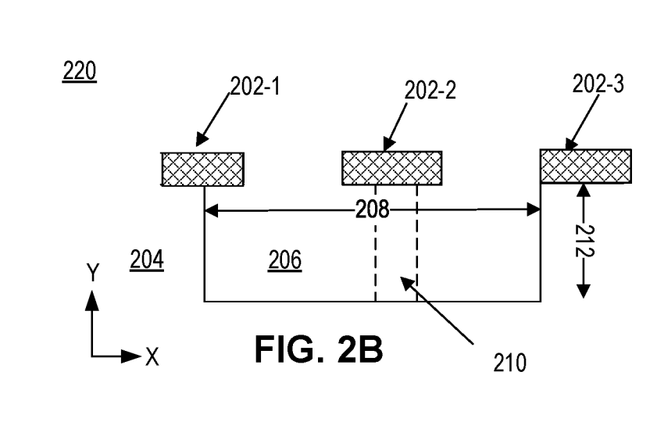
Figure 2C:
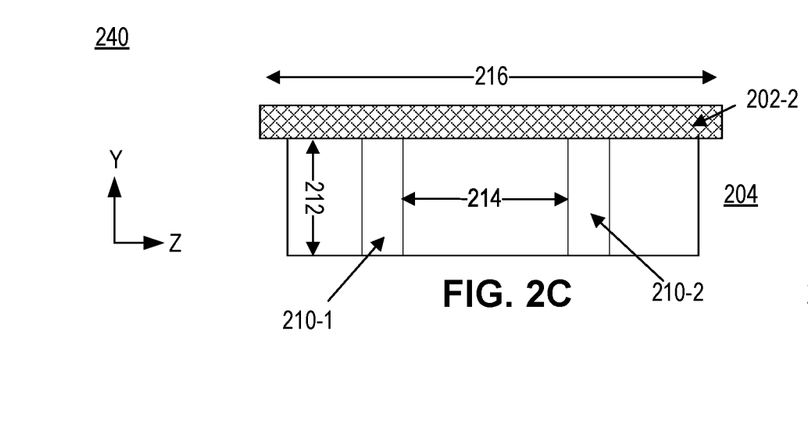

FIG. 2B illustrates a cross-sectional view of sample 200 along line A-A of FIG. 2A. FIG. 2C illustrates a cross-sectional view of sample 200 along line B-B of FIG. 2A.

As shown in FIG. 2B, trench 206 has a width 208 and extends entirely beneath superconductor layer 202-2. In this schematic, the width 208 of the trench 206 extends to a plane that is co-planar with the edges of superconductor layer 202-1 and 202-3, without extending underneath the superconductor layers 202-1 and 202-3. As depicted, the superconductor layer 202-2 is at least partially floating over the trench 206 at cross-section A. A pillar 210 is depicted by dashed lines, and is within the plane along the Z-axis of FIG. 2B. Trench 206 has a depth 212 within dielectric substrate 204. In some implementations, the depth 112 extends into the dielectric substrate from a plane that is co-planar with the bottom surface of a superconductor layer 202. In some implementations, a trench depth may be established by the amount of a dielectric substrate that is removed by an etching process, which will be discussed in more detail with reference to FIGS. 3A and 3B below.

FIG. 2C is a schematic 240 illustrating a cross-sectional view of the superconductor layer 202-2 depicted in FIG. 2A along a cross-section B-B. Schematic 240 depicts superconductor layer 202-2 along a length 216 of the superconductor layer 202-2, such that two pillars 210-1 and 210-2 are visible. Length 216 may range from 100 nm to several 100 microns (e.g., 120 microns), depending on the quantum circuit element that includes the superconductor layer. Pillars 210-1 and 210-2 are separated by a distance 214. In some implementations, two or more pillars have distances between the pillars that is periodic or random. Additionally, pillars may be of a variety of geometric or irregular shapes, and need not be all identical. For instance, pillars may have a cylindrical shape, a cube-like shape, or a rectangular prism shape, among other shapes.

In some implementations, a separation between pillars may range from a few microns to several hundred microns. Additionally, the pillars may range in dimensions. Pillars may have a height defined as extending from a top surface (e.g., floor) of the trench and extending to a bottom surface of the superconductor layer. Pillars may have one or more additional dimensions (e.g., width, length, or diameter) extending along a plane orthogonal to the height, wherein the size of the one or more dimensions that extend along the plane orthogonal to the height may be between tens of nanometers to several microns. Trench dimensions (e.g., length, width, and depth) in a floating layer configuration may be similar to the trench dimensions discussed above with reference to FIGS. 1A-D. In some implementations one or more of the trench dimensions (e.g., length, width, and depth) may be selected based on one or more dimensions (e.g., length or width) of the quantum computing circuit element (e.g., a coplanar waveguide) adjacent to which the trench is incorporated.

As described herein, pillars are portions of the substrate that are not removed and that support the superconductor layer. A process for forming pillars is described in further detail below with reference to FIG. 3B.

Figure 2D:
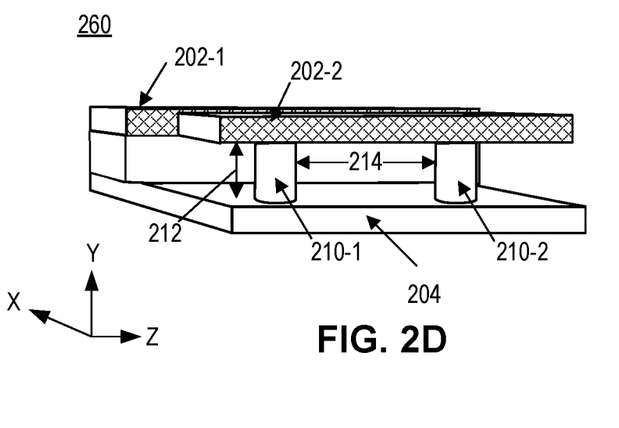

FIG. 2D is a schematic 260 illustrating a perspective view of superconductor layers 202-1 and 202-2 depicted in FIG. 2A. Schematic 260 depicts the partially floating superconductor layer 202-2 with pillars 210-1 and 210-2 that are separated by a distance 214. Pillars 210-1 and 210-2 support superconductor layer 202-2 and may, in some implementations, be formed from the dielectric substrate 204. Pillars have a height 212, which may be equal to the height of the trench 206. The distance 214 between pillars may be variable, periodic or random. Pillars are depicted in FIGS. 2A-2D as columnar, but may be of various geometric or irregular shapes and need not be all identical.

In some implementations, some or all of the above-mentioned features (e.g., a trench adjacent to a superconductor layer, a trench partially underneath a superconductor layer, a partially floating superconductor layer) may be part of a quantum computing circuity element including a qubit coupling device.

Trench Fabrication

A variety of fabrication processes may be used to fabricate trenches in a dielectric substrate adjacent to a superconductor layer on top of the substrate including, e.g., dry chemical etch (such as a gas phase etching with or without plasma), wet etching, physical etching (such as inductively coupled plasma etch or ion-beam milling), physical-chemical etching (such as reactive ion-beam etching or chemically-assisted ion-beam etching), or combinations thereof.

Certain fabrication processes may be preferable to others depending on the size of the trench and the materials of the superconductor layer and dielectric substrate. For example, $SF_6/O_2$ is an anisotropic etchant of silicon for an aluminum superconductor layer deposited on a silicon dielectric substrate. $SF_6/O_2$ may also be used as an etchant for different dielectric and/or superconductor layer materials (e.g., sapphire, niobium-titanium).

Additionally, some fabrication processes and/or trenches may lead to decreased performance of one or more quantum circuit elements due to decoherence induced by the fabrication process and/or trenches. For example, one factor leading to decoherence of a qubit is flux noise. In some implementations, flux noise may result from the exposure of additional surfaces of a superconductor layer in a quantum circuit element during fabrication to environmental contaminants (e.g., oxygen). As result, trenches adjacent to a superconductor layer included in a qubit device may be only adjacent to (but not underneath) the superconductor layer.

Figure 3A:
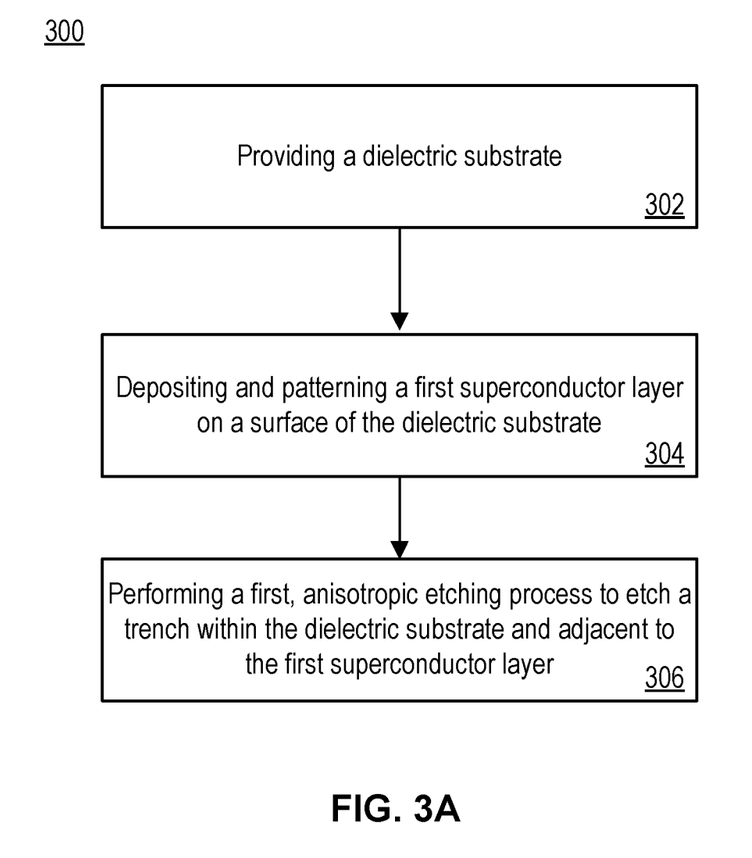
FIGS. 3A and 3B are flow diagrams of exemplary processes for fabricating trenches and floating superconductor layers, respectively.

FIG. 3A is a flow-diagram of an exemplary process 30 for forming the structures illustrated in FIG. 1B. A dielectric substrate such as silicon or sapphire is provided (302) and a first superconductor layer is deposited and patterned on a surface of the dielectric substrate (304). A superconductor layer may include aluminum, niobium-titanium, or other materials or alloys having superconducting properties below a critical temperature. Superconductor layers may be deposited directly onto the dielectric substrate, deposited through one or more masks, post-processed in separate etching processes or the like. A superconductor layer may have a planar geometry (e.g., a trace, a loop, parallel traces, or squares) and form part or all of one or more devices (e.g., coplanar waveguide, a qubit device, a qubit coupler, among other devices). An etching process is performed to etch one or more trenches within the dielectric substrate and adjacent to one or more superconductor layers (306). To form the trench structure shown in FIG. 1B, in which the trench sidewalls do not extend underneath the superconductor layers, an anisotropic etching process may be selected. Furthermore, the superconductor may serve as an etch mask to protect portions of the substrate beneath the superconductor layer from being etched. For example, for an aluminum superconductor layer on a silicon substrate, a dry etch ICP of a ratio of $SF_6$:$O_2$ at 500 W may be used to fabricate adjacent trenches in the silicon substrate to superconductor layers with little to no undercutting of the superconductor layer. Oxygen ($O_2$) may be used to prevent undercutting of the superconductor layer with $O_2$ pressures ranging in a few Pascal. In some implementations a ratio of 2:1 for the $SF_6$:$O_2$ is used in the etching process. In some implementations, an etch rate is approximately 110 nm/min, but may vary depending on process parameters. Additionally, the substrate may be biased (e.g., at 50 W) during the etching process.

Figure 3B:
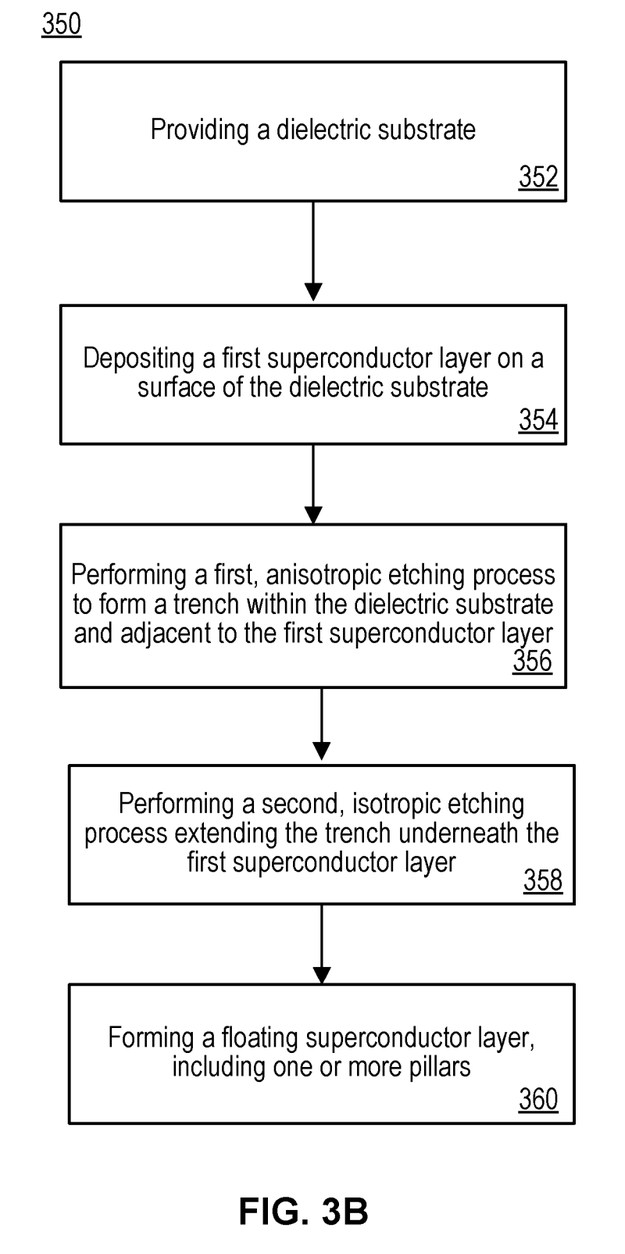

FIG. 3B is a schematic that illustrates a flow-diagram of an exemplary process 350 for forming the structures illustrated in FIG. 1C or in FIGS. 2A-2D. A dielectric substrate such as silicon or sapphire is provided (352) and a first superconductor layer is deposited on a surface of the dielectric substrate (354). A first, anisotropic etching process is performed to etch one or more trenches within the dielectric substrate and adjacent to a first superconductor layer (356). Following the formation of a trench within the dielectric substrate and adjacent to the superconductor layer, a second, isotropic etching process is performed (358). For example, for an aluminum superconductor layer with one or more adjacent trenches within a silicon substrate, a plasmaless dry etch of $XeF_2$ may be used to release the superconductor layer from the substrate. The $XeF_2$ etch is an isotropic etchant for silicon, and is highly selective for silicon relative to aluminum such that during the time required to remove the silicon to form a trench according to the present disclosure, the aluminum layer is effectively etched very little. Rather, the aluminum layer acts as a mask for the etching of silicon. The second, isotropic etching process may be further used to extend the trench such that a portion of the trench is underneath the superconductor layer. The degree to which the trench is extended underneath the superconductor layer may vary, as depicted in FIGS. 1C and 1D. The isotropic etching process may continue such that the trench is entirely underneath the superconductor layer for at least a portion of the superconductor layer, forming a floating superconductor layer (360). The floating superconductor layer includes one or more pillars, as depicted in FIGS. 2A-2D.

In some implementations, the $XeF_2$ etching step is isotropic and may etch (albeit at a slower rate) the superconductor layer as well as the dielectric substrate, such that as the $XeF_2$ undercuts the superconductor layer it also will etch part of the superconductor layer. Design accommodations (e.g., biasing the superconductor layer such that it is the desired dimensions post-etch) may be implemented to compensate for the isotropic etch.

In some implementations, one or more masks may be deposited over the superconductor layer prior to the one or more etching processes. The one or more masks may be used to prevent etching of trenches or undercutting of particular superconductor layers or portions of superconductor layers in particular regions of a substrate. For example, for a qubit device adjacent to an inductive coupling device, it may be desired to etch trenches adjacent to the superconductor layers forming the inductive coupling device and not the qubit device. A mask (e.g., a pattern resist mask layer) may be utilized to selectively expose the dielectric substrate adjacent to the superconductor layers forming the inductive couple device such that only the exposed areas are etched. In another example, a mask may be utilized between the one or more etching processes such that only certain trenches fabricated in first anisotropic etching process are additionally etched by a second anisotropic etching process.

In some implementations, the pillars that support the floating superconductor layer may be formed as follows. In a first step, the dielectric substrate having a patterned superconductor layer is provided. For example, the superconductor layer may have been etched to form a square, trace or other pattern. The superconductor layer also may have been patterned to include one or more openings or holes within the superconductor layer. The openings or holes may extend from a top surface of the superconductor layer through the superconductor layer thickness to the dielectric substrate. When multiple openings or holes are provided, the openings or holes may be periodically spaced apart from one another by a fixed distance. The substrate having the patterned superconductor layer then may be exposed to an etchant, such as $XeF_2$, that passes through the openings or holes and etches the underlying substrate. The etch process may be timed such that, although a substantial portion of the underlying substrate is etched, pillars remain that continue to support the superconductor layer.

Processes 300 and 350 should be taken as two of many different fabrication processes possible for forming trenches, and should not limit the full scope of fabrication techniques possible for fabricating the trenches described in reference to FIGS. 1A-D and 2A-D.

Trenches implemented in different quantum circuit element (e.g., qubit coupler elements, qubit devices, among other quantum circuit elements), may require different optimal trenches and fabrication processes. For example, for a quantum circuit element having relatively wide (e.g., ~15 micron) traces, a fabrication process for etching adjacent trenches and etching underneath the superconductor trace may require additional fabrication steps. A first step may involve etching trenches using a first fabrication technique (e.g., dry etch ICP), where the walls of the etched trenches are perpendicular to a top surface of the superconductor layer. A second step may require forming holes in the superconductor layer in order to allow a second etch to evenly etch the dielectric substrate underneath the superconductor layer, in order to undercut the superconductor layer such that a substantial portion of the underlying substrate is etched.

In some implementations, once a trench is fabricated, it may be filled with a different material rather than being left as vacuum. For example, the trench may be filled with a material having low electric permittivity (relative to the dielectric substrate) and which is also compatible with the fabrication processes of the quantum circuit elements. For example, silicon dioxide, or doped variants of silicon dioxide (e.g., fluorine-doped silicon dioxide, carbon-doped silicon dioxide) may be deposited by chemical vapor deposition. Silicon dioxide can additionally be deposited by some electron beam evaporation or sputtering techniques, as well as by spin-on-glass techniques. Other materials having low electric permittivity including Teflon, which can be deposited by chemical vapor deposition as well as spin-on methods, and various polymers (e.g., photoresist, polyimide), can be used to fill the trench.

Various quantum computing circuit elements and components may benefit from one or more trenches adjacent to the superconductor layers forming the quantum computing circuit elements. Examples of quantum computing circuit elements include Josephson junctions, superconductor coplanar waveguides, quantum LC oscillators, qubits (e.g., flux qubits or charge qubits), superconducting quantum interference devices (SQUIDs) (e.g., RF-SQUID or DC SQUID), inductors, capacitors, transmission lines, ground planes, among others.

Figure 4A:
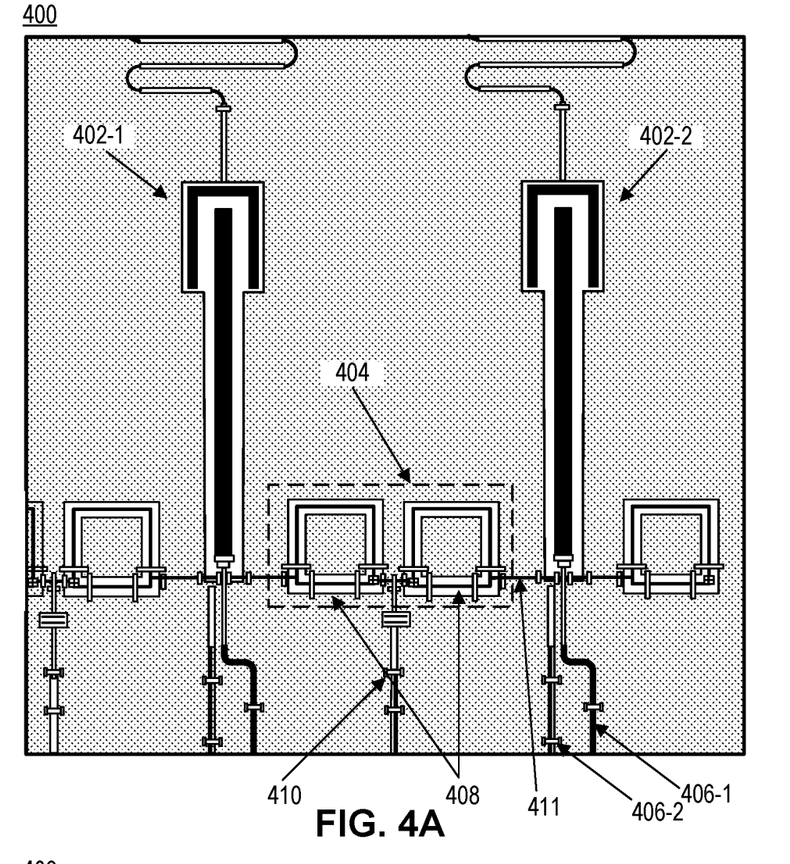
FIG. 4A is a schematic that illustrates an exemplary layout of a Gmon coupler including two Gmon qubits and a tunable coupler network.
Figure 4B:
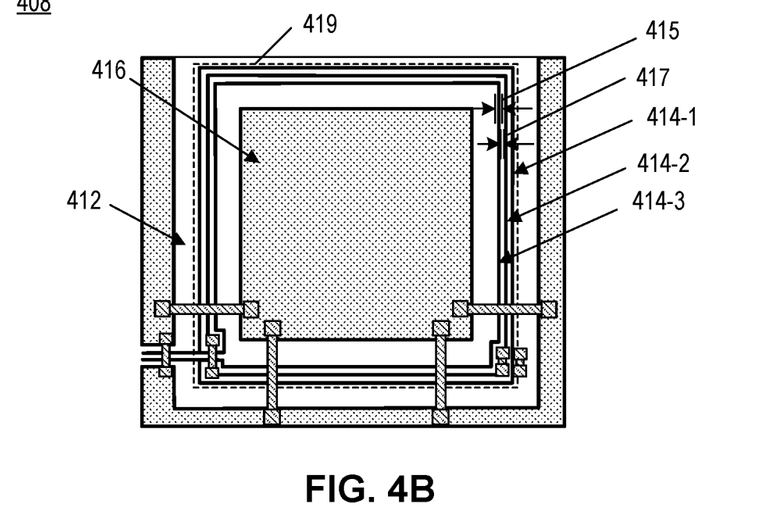
FIG. 4B is a schematic that illustrates the tunable coupler network of FIG. 4B.

An example of a quantum computing circuit element may be a qubit coupling device that includes an adjustable coupler network and one or more coupler control lines. FIGS. 4A and 4B are schematics that illustrate an exemplary layout of a Gmon coupler 400 including two Gmon qubits 402-1, 402-2 and a tunable coupler network 404. It may be understood in FIGS. 4A and 4B that areas of the figures depicted as white are exposed dielectric substrate and that non-white areas have at least a superconductor layer and/or dielectric layer on the surface. In some implementations, areas depicted as white are locations in which a trench may be fabricated using techniques discussed herein.

A Gmon coupler 400 may be understood to include at least two qubit devices 402-1 and 402-2 that are coupled through a tunable coupler network 404. The Gmon coupler 400 may have a planar architecture in which one or more patterned superconductor layers on a dielectric substrate form the qubit devices and coupling network. The coupler network 404, in particular, may be formed from a superconductor line having a junction that acts as a tunable inductor to control the coupling strength between the qubit devices 402-1, 402-2.

A description of qubit 402-2 will now be provided, though both qubits 402-1, 402-2 have the same structure. Qubit 402-2 has two coplanar waveguide control lines 406-1 and 406-2. The control lines 406-1 and 406-2 include one control line for exciting states in the qubit 402-2 and one control line for tuning the frequency of the qubit. Coupler network 404 includes two superconductor traces 408 arranged in loops. Additionally, coupler network 404 includes a coupler control line 410 for tuning the inductance of the couplers 408. Each qubit device is fabricated from a superconductor layer (e.g., aluminum operating at or below its superconducting temperature) on top of a dielectric substrate (e.g., silicon). At least a portion of the superconductor layer of the qubit is in contact with the dielectric substrate. Though a Gmon qubit is depicted for qubits 402-1, 402-2, qubit devices 402-1 and 402-2 may include qubits of different types (e.g., xmon qubits, transmon qubits and flux qubits). Each qubit (e.g., qubit 402-2) includes superconductor traces 411 which inductively couple the qubit to the coupling network 404, described in more detail with respect to FIG. 4B.

FIG. 4B is a schematic illustrating a layout of coupler 408. As described herein, areas depicted as non-white correspond to at least a layer of superconductor material and/or dielectric material (e.g., ground plane 416 within the coupler, and traces 414 of the coupler) and areas depicted as white 412 correspond to areas in which the dielectric substrate is exposed, and in which a trench may be fabricated using techniques discussed herein. For example, a trench may be formed as depicted in FIG. 1B in which the width of a trench extends to, but no further than, an edge of a superconductor layer, or as in FIG. 1C, in which a portion of the trench extends partially but not entirely underneath the adjacent superconductor layer, or as in FIG. 2A-2D, in which a portion of the trench extends entirely underneath the adjacent superconductor layer.

The inductive coupler 408 includes three traces (e.g., traces approximately 1.5 microns wide) 414-1, 414-2, and 414-3. In some implementations, a width 415 of each trace relative to a distance 417 between the traces is small such that each trace is close to each other trace, and a strong (e.g., maximum) amount of inductive coupling is achieved. The qubits each include a superconductor trace 414-1 and 414-3 that form loops on either side of a coupler trace 414-2 of the inductive coupler 408 within the coupling network 404. Trace 414-2 inductively couples a the inductive coupler to the qubit through traces 414-1 and 414-3 of the qubit. Traces 414-1, 414-2, 414-3 each form a respective loop 419 (e.g., a square loop as depicted in FIG. 4B). The length of trace 414-2 for which the trace 414-2 forms a loop 419 between the respective loops formed by the two traces 414-1 and 414-3 is a length over which mutual inductance may occur between the qubit and the inductive coupler. Again, areas depicted as white are locations in which a trench may be fabricated using techniques discussed herein. By forming the trenches in those areas, it may be possible to reduce the parasitic capacitance of the gmon coupler 400. For example, the parasitic capacitance of the qubits 402-1, 402-2, and the coupler network 404 may be reduced.

Figure 5A:
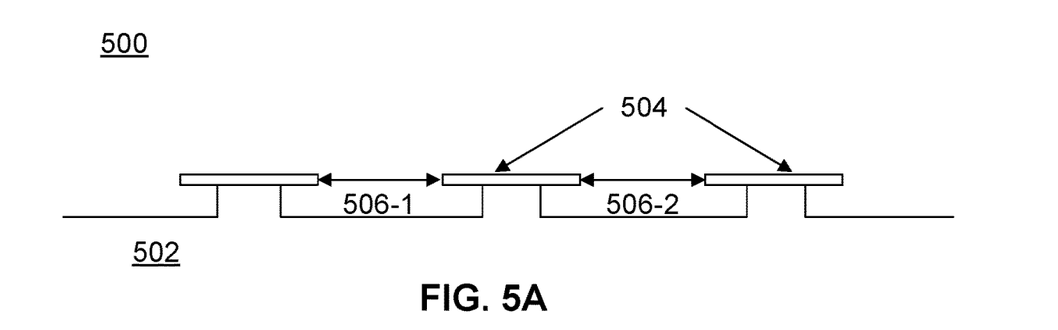
FIGS. 5A and 5B depict a simulated layout of trenches and a plot of simulation results depicting improvements in capacitance/length on various trench configurations, respectively.
Figure 5B:
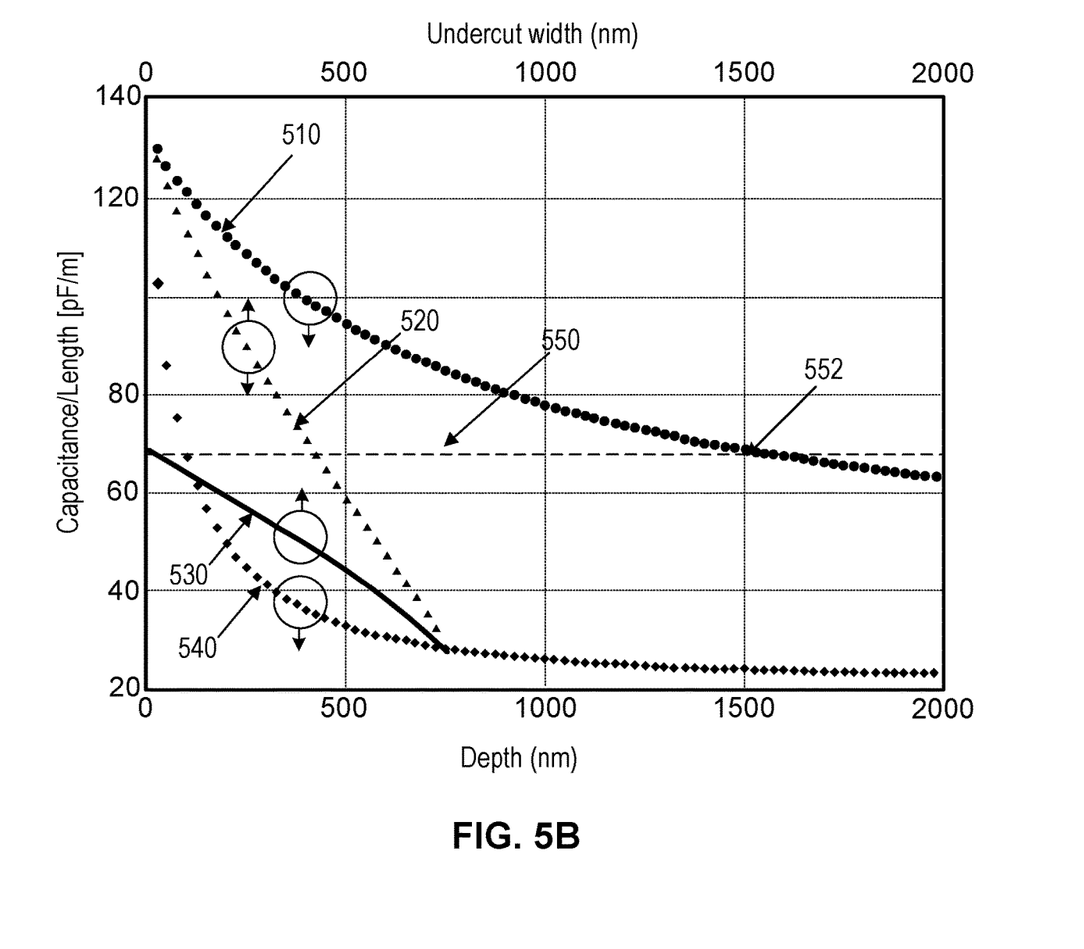

FIGS. 5A and 5B depict an exemplary simulated layout of trenches and a plot of simulation results depicting improvements in capacitance/length on various trench configurations, respectively. FIG. 5A depicts a simulated exemplary layout 500 of a dielectric substrate 502 with a superconductor layer 504. Trench widths 506-1 and 506-2 are adjacent to superconductor layer 504 and have an amount of width extending underneath superconductor layer 504.

FIG. 5B is a plot of simulation results depicting a dependence of capacitance/length of a superconductor layer (e.g., a trace) on a dielectric substrate on a depth into the dielectric substrate of a trench adjacent to the superconductor layer (e.g., a trace). Four different trenches are simulated using four different respective parameter sweeps. In the simulation plot of FIG. 5B, the superconductor layers 504 are 1.5-micron in width and are separated from one another by 1.5-micron gaps (506-1 and 506-2). The plot of FIG. 5B depicts capacitance per unit length of the superconductor layer 504, where each curve represents a different example of varying trench widths between the superconductor layers 504 (e.g., undercut width) and/or trench depth. Each curve 510, 520, 530, and 540 is indicated in FIG. 5B as corresponding to respective x-axis (e.g., undercut width and/or depth of trench). Curve 510 corresponds to a trench having a width that extends up to an edge of a superconductor layer, but no further (e.g., the trench does not extend underneath the superconductor layer (as depicted in FIG. 1B)). Curve 520 corresponds to a simulated trench having a width that at least partially extends underneath an adjacent superconductor trace (e.g., as depicted in FIGS. 1C and 5A). Curve 530 corresponds to a simulated trench that has a fixed trench depth of 1.5 microns and a varied amount of width of the trench is underneath the superconductor layer until the point where the superconductor layer is fully undercut such that the trench extends entirely underneath the superconductor layer such that the superconductor layer is fully released and floating on pillars (e.g., as depicted in FIGS. 2A-2D). Curve 540 was produced by simulating a superconductor layer floating on top of a dielectric substrate surface rather than on a dielectric surface in which a trench is formed, wherein the trench depth is simulated as a distance between the superconductor layer and the dielectric substrate surface. The dashed line 550 highlights a same result for two different parameter sweeps for curves 510 and 530, such that the crossover point between dashed line 530 and curve 510 and the crossover point between dashed line 550 and curve 530 represent a same simulated structure including 1.5 micron trench depth and no undercut of the superconductor layer.

Curve 510 reaches a roll-over 552 point near a trench depth that is similar to the trench width (~1.5 microns). Curve 530 additionally shows a greater reduction in capacitance/length over curve 510, suggesting that undercutting the superconductor layer further reduces the parasitic capacitance effects.

For the purposes of this disclosure, a superconducting (alternatively "superconductor") material can be understood as material that exhibits superconducting properties at or believe a superconducting critical temperature. Examples of superconductor material include aluminum (superconductive critical temperature of 1.2 kelvin) and niobium (superconducting critical temperature of 9.3 kelvin).

Additionally, for the purposes of this disclosure, a dielectric substrate or a dielectric material can be understood as material that is an electrical insulator that can be polarized by an applied electric field. Examples of dielectric substrates include silicon (bulk dielectric constant of 11.7) and sapphire (bulk dielectric constant of 11.5).

An example of a superconductor material that can be used in the formation of quantum computing circuit elements is aluminum. Aluminum may be used in combination with a dielectric to establish Josephson junctions, which are a common component of quantum computing circuit elements. Examples of quantum computing circuit elements that may be formed with aluminum include circuit elements such as superconductor co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

Aluminum may also be used in the formation of superconductor classical circuit elements that are interoperable with superconductor quantum computing circuit elements as well as other classical circuit elements based on complementary metal oxide semiconductor (CMOS) circuitry. Examples of classical circuit elements that may be formed with aluminum include rapid single flux quantum (RSFQ) devices, reciprocal quantum logic (RQL) devices and ERSFQ devices, which are an energy-efficient version of RSFQ that does not use bias resistors. Other classical circuit elements may be formed with aluminum as well. The classical circuit elements may be configured to collectively carry out instructions of a computer program by performing basic arithmetical, logical, and/or input/output operations on data, in which the data is represented in analog or digital form.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum computing circuit elements may be used to perform quantum processing operations. That is, the quantum computing circuit elements may be configured to make use of quantum-mechanical phenomena, such as superposition and entanglement, to perform operations on data in a non-deterministic manner. Certain quantum computing circuit elements, such as qubits, may be configured to represent and operate on information in more than one state simultaneously. Examples of superconducting quantum computing circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum computing circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum computing circuit elements and/or superconducting classical circuit elements, such as the circuit elements described herein, the superconducting circuit elements are cooled down within a cryostat to temperatures that allow a superconducting material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

The invention claimed is:

1. A qubit coupling device comprising:
   a dielectric substrate comprising a surface and a trench extending from the surface into the dielectric substrate; and
   a first superconductor layer on the surface of the dielectric substrate, wherein an edge of the first superconductor layer is adjacent to the trench, wherein at least a portion of the superconductor layer is in contact with the surface of the dielectric substrate, and wherein the superconductor layer is formed from a superconductor material that exhibits superconductor properties at or below a corresponding critical temperature, and wherein an electric permittivity of the trench is less than an electric permittivity of the dielectric substrate.

2. The qubit coupling device of claim 1, further comprising:
   a second superconductor layer on the surface of the dielectric substrate, wherein at least a portion of the second superconductor layer is in contact with the surface of the dielectric substrate, and wherein the edge of the second superconductor layer extends over the trench.

3. The qubit coupling device of claim 2, wherein the second superconductor layer comprises at least a portion of a qubit coupler.

4. The qubit coupling device of claim 1, wherein the first superconductor layer comprises at least a portion of a qubit device.

5. The qubit coupling device of claim 1, wherein a depth of the trench extends into the dielectric substrate from a plane that is co-planar with a bottom surface of the first superconductor layer.

6. The qubit coupling device of claim 1, wherein the first superconductor layer comprises at least a portion of a capacitor.

7. The qubit coupling device of claim 1, wherein the first superconductor layer comprises at least a portion of an inductive coupler.

8. The qubit coupling device of claim 1, wherein the first superconductor layer comprises at least a portion of a transmission line.

9. The qubit coupling device of claim 1, wherein the first superconductor layer comprises at least a portion of a capacitive coupler.

10. The qubit coupling device of claim 1, wherein the dielectric substrate comprises one or more pillars within the trench and the first superconductor layer is formed directly on a surface of the one or more pillars.

11. The qubit coupling device of claim 1, wherein a pressure within the trench is below approximately $10^{-9}$ Torr.

12. The qubit coupling device of claim 1, wherein a width of the trench extends entirely underneath the first superconductor layer.

13. The qubit coupling device of claim 1 comprising:
   a first qubit device;
   a second qubit device; and
   a qubit coupler, wherein the first superconductor layer forms part of the qubit coupler.

14. The qubit coupling device of claim 1 comprising:
   a first qubit device;
   a second qubit device; and
   a qubit coupler, wherein the first superconductor layer forms part of the first qubit or the second qubit.

* * * * *